US009827592B2

(12) United States Patent
Lee et al.

(10) Patent No.: US 9,827,592 B2
(45) Date of Patent: Nov. 28, 2017

(54) ULTRASONIC PROBE AND METHOD OF MANUFACTURING THE SAME

(71) Applicant: SAMSUNG MEDISON CO., LTD., Gangwon-Do (KR)

(72) Inventors: Won Hee Lee, Seoul (KR); Min Seon Seo, Gyeongju-Si (KR); Bo Yun Kim, Seoul (KR)

(73) Assignee: SAMSUNG MEDISON CO., LTD., Gangwon-Do (KR)

( * ) Notice: Subject to any disclaimer, the term of this patent is extended or adjusted under 35 U.S.C. 154(b) by 535 days.

(21) Appl. No.: 14/472,290

(22) Filed: Aug. 28, 2014

(65) Prior Publication Data

US 2015/0061465 A1 Mar. 5, 2015

(30) Foreign Application Priority Data

Aug. 28, 2013 (KR) ........................ 10-2013-0102207

(51) Int. Cl.
*H01L 41/04* (2006.01)
*B06B 1/06* (2006.01)
*G10K 11/00* (2006.01)

(52) U.S. Cl.
CPC .............. *B06B 1/06* (2013.01); *G10K 11/002* (2013.01); *B06B 1/0685* (2013.01); *Y10T 29/42* (2015.01)

(58) Field of Classification Search
CPC ...... H01L 41/0471; B06B 1/06; G10K 11/002
USPC ............... 310/334; 29/594; 361/807; 607/57
IPC ........... B06B 1/06; H01L 29/786; G10K 11/00
See application file for complete search history.

(56) References Cited

U.S. PATENT DOCUMENTS

2007/0276248 A1 11/2007 Saito et al.
2009/0009035 A1 1/2009 Yamashita et al.
2010/0041069 A1* 2/2010 Lederkremer ......... G01N 33/68 435/7.4
2011/0114303 A1* 5/2011 Rhim ....................... A61B 8/00 165/185

FOREIGN PATENT DOCUMENTS

WO 2012/123908 A2 9/2012

OTHER PUBLICATIONS

Search Report European Patent Application No. 14176892.9 dated Sep. 10, 2015.

* cited by examiner

*Primary Examiner* — Thomas Dougherty
*Assistant Examiner* — Karen B Addison
(74) *Attorney, Agent, or Firm* — McDermott Will & Emery LLP

(57) ABSTRACT

Provided is an ultrasonic probe that is capable of easily dissipating heat generated therein using porous carbon allotrope foams. The ultrasonic probe includes: a matching layer; a piezoelectric layer disposed on a bottom surface of the matching layer; and a backing layer disposed on a bottom surface of the piezoelectric layer and formed of porous carbon allotrope foams and backing materials.

10 Claims, 7 Drawing Sheets

ULTRASONIC PROBE AND METHOD OF MANUFACTURING THE SAME

CROSS-REFERENCE TO RELATED APPLICATION

This application claims the benefit of Korean Patent Application No. P2013-0102207, filed on Aug. 28, 2013 in the Korean Intellectual Property Office, the disclosure of which is incorporated herein by reference.

BACKGROUND

1. Field

Embodiments of the present invention relate to an ultrasonic probe for generating an image of an inside of a subject using ultrasonic waves.

2. Description of the Related Art

Ultrasonic diagnosis apparatuses are apparatuses that radiate ultrasonic signals onto a target part of a body from a body surface of the subject and obtain a tomogram of a soft tissue or an image of blood flow of the soft tissue using information regarding reflected ultrasonic signals (ultrasonic echo signals) in a noninvasive manner.

In comparison with other image diagnosis apparatuses, such as X-ray diagnosis apparatuses, X-ray computerized tomography (CT) scanners, magnetic resonance imaging (MRI) apparatuses, and nuclear medicine apparatuses, ultrasonic diagnosis apparatuses are small-sized and cheap, can be displayed in real time and have high safety due to lack of radiation exposure. Thus, ultrasonic diagnosis apparatuses are widely used in heart, abdominal, urinary, and ob-gyn diagnoses.

An ultrasonic diagnosis apparatus includes an ultrasonic probe that transmits ultrasonic signals to the subject and receives ultrasonic echo signals reflected from the subject so as to obtain an ultrasonic image of the subject.

The ultrasonic probe includes a transducer layer that transforms between electrical signals and sound signals while a piezoelectric material vibrates, a matching layer that reduces a difference in sound impedance between the transducer layer and the subject so that ultrasonic waves generated in the transducer layer can be transmitted to the subject as much as possible, a lens that focuses ultrasonic waves proceeding toward the front of the transducer layer on a particular place, and a backing layer that prevents image distortion by blocking progression of the ultrasonic waves toward the rear of the transducer layer.

SUMMARY

Therefore, it is an aspect of the present invention to provide an ultrasonic probe that is manufactured using porous carbon allotrope foams, and a method of manufacturing the same.

Additional aspects of the invention will be set forth in part in the description which follows and, in part, will be obvious from the description, or may be learned by practice of the invention.

In accordance with one aspect of the present invention, an ultrasonic probe includes: a matching layer; a piezoelectric layer disposed on a bottom surface of the matching layer; and a backing layer disposed on a bottom surface of the piezoelectric layer and formed of porous carbon allotrope foams and backing materials.

The carbon allotropes may include at least one of graphene and carbon nanotubes (CNTs).

In the backing layer, backing materials may be injected into pores of the porous carbon allotrope foams.

The backing materials may include a combined material of at least one of a metal powder, a ceramic powder, and a carbon allotrope powder and an epoxy resin.

A diameter of each of the pores of the porous carbon allotrope foams may be between 1 nm and 1 mm.

The ultrasonic probe may further include a heat sink that is disposed on a bottom surface of the backing layer and dissipates heat generated in the ultrasonic probe to the outside.

In accordance with another aspect of the present invention, a method of manufacturing an ultrasonic probe includes: disposing a backing layer including backing materials; disposing a piezoelectric layer on a top surface of the backing layer; and disposing a matching layer on a top surface of the piezoelectric layer, wherein the backing layer may further include porous carbon allotrope foams.

Carbon allotropes of the backing layer may include at least one of graphene and carbon nanotubes (CNTs).

The disposing of the backing layer may include disposing the backing layer by injecting the backing materials into pores of the porous carbon allotrope foams.

The backing materials may be manufactured by combining at least one of a metal powder, a ceramic powder and a carbon allotrope powder and an epoxy resin.

A diameter of each of pores of the porous carbon allotrope foams may be between 1 nm and 1 mm.

The method may further include disposing a heat sink that dissipates heat generated in the ultrasonic probe to the outside on a bottom surface of the backing layer.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION

Figure 1:
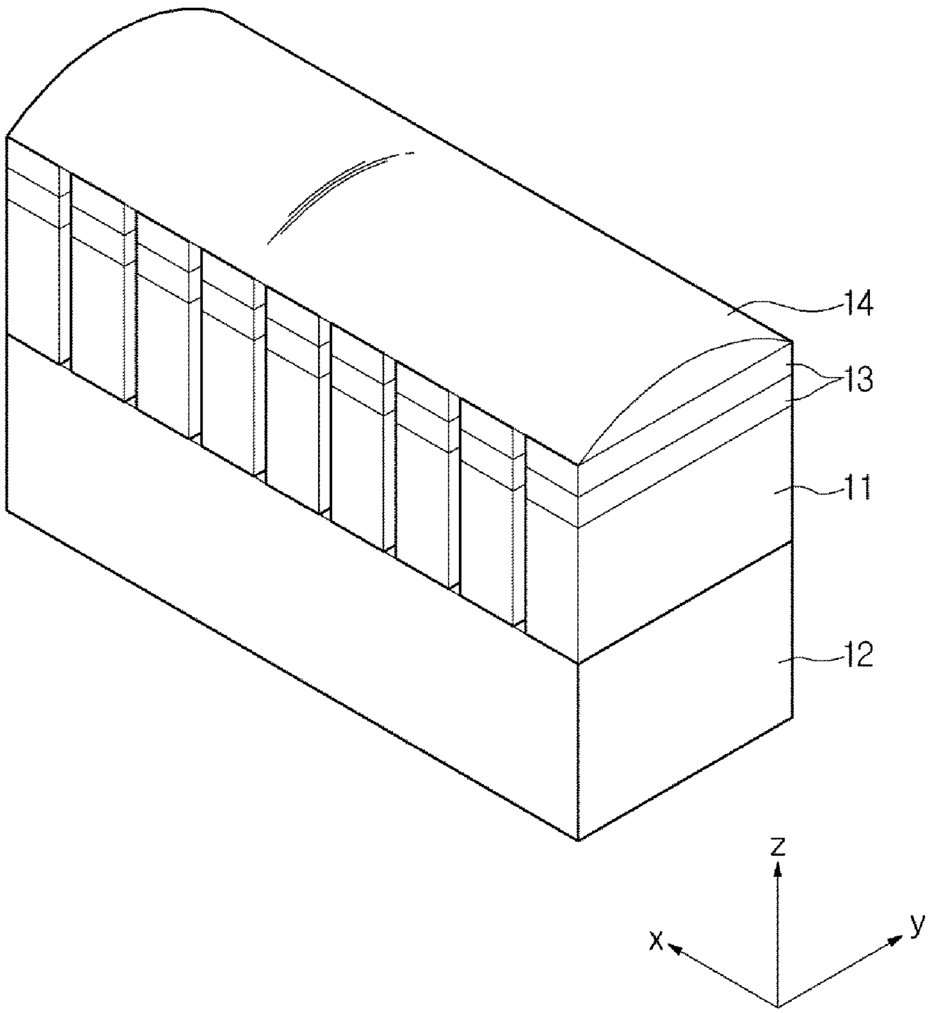
FIG. 1 is a perspective view of an ultrasonic probe in accordance with an embodiment of the present invention.

Reference will now be made in detail to the embodiments of the present invention, examples of which are illustrated in the accompanying drawings, wherein like reference numerals refer to like elements throughout.

Figure 2:
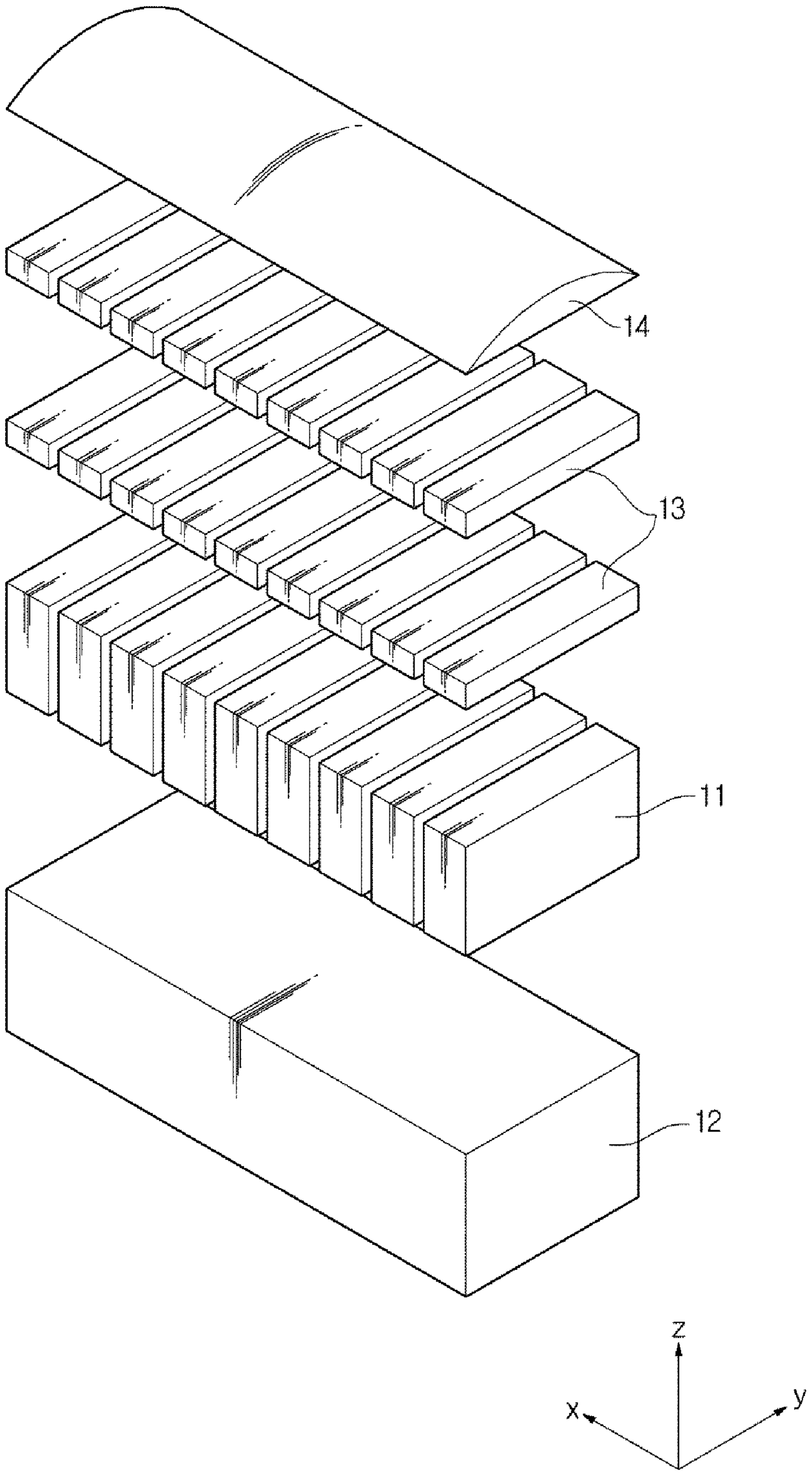
FIG. 2 is an exploded perspective of the ultrasonic probe illustrated in FIG. 1.

FIG. 1 is a perspective view of an ultrasonic probe in accordance with an embodiment of the present invention, and FIG. 2 is an exploded perspective of the ultrasonic probe illustrated in FIG. 1.

The ultrasonic probe of FIG. 1 includes a piezoelectric layer 11, a matching layer 13 disposed on a top surface of the piezoelectric layer 11, a lens 14 installed at a top surface of the matching layer 13, and a backing layer 12 disposed on a bottom surface of the piezoelectric layer 11.

The effects that, if mechanical pressure is applied to a predetermined material, a voltage is generated and if a voltage is applied to the predetermined material, mechanical deformation occurs, are referred to as a piezoelectric effect and an inverse piezoelectric effect, and a material having these effects is referred to as a piezoelectric material. That is, the piezoelectric material is a material that transforms electric energy into mechanical vibration energy or vice versa.

The ultrasonic probe of FIG. 1 includes the piezoelectric layer 11 that transforms a received electrical signal into mechanical vibration so as to generate ultrasonic waves.

The piezoelectric material that constitutes the piezoelectric layer 11 may include a ceramic of lead zirconate titanate (PZT), a PZMT monocrystal formed of a solid solution of lead magnesium niobate (PMN) and lead titanate (PT), or a PZNT monocrystal formed of a solid solution of lead zinc niobate (PZN) and PT.

The matching layer 13 is disposed on the top surface of the piezoelectric layer 11 and reduces a difference in sound impedance between the piezoelectric layer 11 and the subject so that ultrasonic waves generated in the piezoelectric layer 11 can be efficiently transferred to the subject. The matching layer 13 may be formed to have one or more layers.

The matching layer 13 may be divided into a plurality of units having predetermined widths together with the piezoelectric layer 11 through a dicing process.

Although not shown, a protective layer may be disposed on the top surface of the matching layer 13. The protective layer may prevent outflow of high frequency components that may be generated in the piezoelectric layer 11 and may block inflow of external high frequency signals. Also, the protective layer may protect internal parts of the ultrasonic probe from water or medicine used in disinfection by coating or depositing a conductive material on the surface of a film having moisture tolerance and chemical resistance.

The lens 14 is installed at the top surface of the matching layer 13. The lens 14 may have a convex shape in a radiation direction of the ultrasonic waves so as to focus the ultrasonic waves, and when sound speed is slower than the human body, the lens 14 may be implemented with a concave shape.

The backing layer 12 is mounted on the bottom surface of the piezoelectric layer 11, absorbs the ultrasonic waves generated in the piezoelectric layer 11 and blocks the ultrasonic waves that proceed toward the bottom surface of the piezoelectric layer 11, thereby preventing distortion of an image. The backing layer 12 may be manufactured as a plurality of layers so as to improve an attenuation or blocking effect of the ultrasonic waves.

The backing layer 12 may include backing materials so as to absorb the ultrasonic waves generated in the piezoelectric layer 11. The backing materials may include a combination of a metal powder (for example, tungsten, copper, and aluminum), a ceramic powder (for example, tungsten oxide and alumina), and a carbon allotrope powder (for example, graphite, graphene, carbon nanotubes (CNTs), and diamond) and an epoxy resin, or rubber. In this case, metals, ceramics, and carbon allotropes may have high attenuation coefficients.

The backing layer 12 may absorb the ultrasonic waves generated in the piezoelectric layer 11 and may dissipate heat generated in the piezoelectric layer 11 to the outside. Hereinafter, the backing layer 12 configured to dissipate heat will be described.

In the ultrasonic probe, vibration of the piezoelectric layer 11 occurs inevitably while the ultrasonic waves are generated and collected, and heat is generated due to vibration. Also, as the size of the ultrasonic probe is reduced, parts used in the ultrasonic probe are highly integrated, and the amount of heat dissipation is increased compared to an ultrasonic probe according to the related art.

Heat generated in this way may not be dissipated to the outside but may be transferred to the lens 14 of the ultrasonic probe. Since the lens 14 directly contacts a patient's skin, heat inside the ultrasonic probe may be directly transferred to the patient and thus may burn the patient's skin. Also, the function of the ultrasonic probe may be degraded due to high-temperature heat, and thus the patient's safety and diagnosis image may be adversely affected. Thus, the ultrasonic probe is required to efficiently dissipate heat.

In order to dissipate heat generated in the ultrasonic probe to the outside, the backing layer 12 may be configured to include a material having high thermal conductivity. In particular, the epoxy resin may be combined with at least one of a metal powder, a ceramic powder, and a carbon allotrope powder having high thermal conductivity, and the combination may be used as the backing layer 12 so that the backing layer 12 can have higher thermal conductivity when the existing backing materials are used.

In this case, the used carbon allotropes may include at least one of graphene and carbon nanotubes (CNTs).

CNTs are a material in which hexagons including 6 carbon atoms are connected to each other and form a tubular shape. A diameter of a CNT is no more than 1.2 nm to 3 nm. Electric conductivity of CNTs is similar to electric conductivity of copper, and strength of CNTs is 100 times that of steel. Also, a CNT has a strong force in which its structure can be maintained in spite of deformation, compared to carbon fiber. In particular, CNTs have thermal conductivity of 2000 W/mK to 6000 W/mK, which is similar to diamond, which has highest thermal conductivity in the natural world.

Graphene may be obtained by separating a thinnest layer from graphite having a structure in which carbon atoms are stacked in a hexagonal honeycomb shape. Like CNTs, graphene is a nano material including carbon, whose atomic number is 6. Graphene has a two-dimensional (2D) planar shape, a thickness of about 0.2 nm and high physical and chemical stability. Also, it is known that graphene conducts electricity 100 times better than copper and causes fast movement of electrons 100 times that of monocrystalline silicon that is mainly used as a semiconductor. In particular, graphene has thermal conductivity of 5000 W/mK that is twice or more that of diamond.

However, even when thermal conductivity of carbon allotropes is high, like in the above embodiment, when the carbon allotropes and metal are simply combined with each other in the form of a powder, thermal conductivity is blocked due to the epoxy resin, and heat dissipation cannot be efficiently performed. Thus, in order to utilize high thermal conductivity of the carbon allotropes, an efficient thermal conductive network is required to be formed.

Figure 3:
FIG. 3 is a front view of porous carbon allotrope foams in accordance with an embodiment of the present invention.

FIG. 3 is a front view of porous carbon allotrope foams in accordance with an embodiment of the present invention.

Carbon allotropes may be formed in the form of foams having a plurality of pores. As mentioned above, since graphene is obtained by separating one layer from graphite, the carbon allotropes generally have a 2D planar structure. However, the backing layer 12 is required to have a threedimensional (3D) multiple layer structure having a uniform thickness so as to perform a function of absorbing the ultrasonic waves. Thus, the carbon allotropes used in the backing layer 12 may be porous carbon allotrope foams including 3D multiple layers.

Since the piezoelectric layer 11 that generates heat is disposed on the top surface of the backing layer 12, the porous carbon allotrope foams are required to be continuously connected to each other in a z-axis direction so as to transfer heat generated in the piezoelectric layer 11 to the outside. This is because, in this structure, heat inside the ultrasonic probe may be transferred to the outside via the backing layer 12.

A bottom-up method, a method using a freeze-drying solution or a method using a foam base may be used to obtain the porous carbon allotrope foams. A method of manufacturing the porous carbon allotrope foams is a well-known technology and thus description thereof will be omitted.

The above-mentioned method is merely an embodiment of the method of manufacturing the porous carbon allotrope foams, and embodiments of the present invention are not limited thereto.

The porous carbon allotrope foams may include a plurality of pores. In an embodiment of the ultrasonic probe, a diameter of each pore formed in the porous carbon allotrope foams may be between 1 nm and 1 mm, but embodiments of the present invention are not limited thereto. The diameter of each pore may differ depending on the method of manufacturing the porous carbon allotrope foams. For example, since, in the method using the foam base, carbon allotropes are formed based on the structure of the foam base, the size of the pores of the foam base may mean the size of pores formed in the porous carbon allotrope foams.

Figure 4:
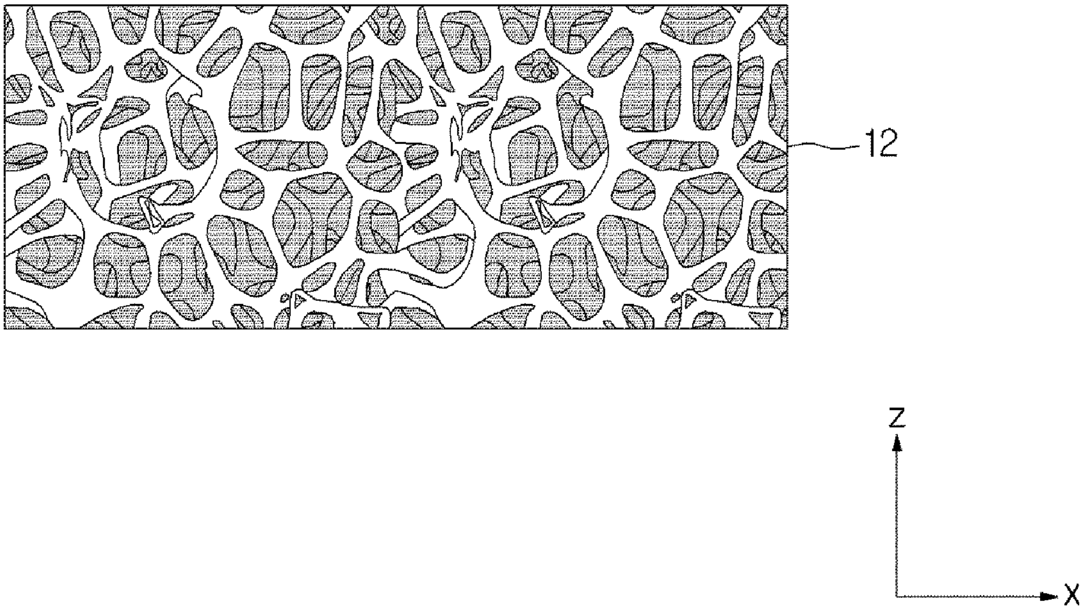
FIG. 4 is a front view of porous carbon allotrope foams in which backing materials are injected into pores in accordance with another embodiment of the present invention.

FIG. 4 is a front view of porous carbon allotrope foams in which backing materials are injected into pores in accordance with another embodiment of the present invention.

As mentioned above, heat in the ultrasonic probe is required to be dissipated through the backing layer 12, and the ultrasonic waves generated in the piezoelectric layer 11 are required to be absorbed. Thus, if the backing layer 12 is formed of only the porous carbon allotrope foams, the backing layer 12 may perform a function of absorbing the ultrasonic waves. When the ultrasonic waves are not absorbed but are transmitted or reflected, an obtained ultrasonic image may be distorted and may be displayed on a screen.

Since the porous carbon allotrope foams include a plurality of pores, the backing materials may be injected into the pores. The backing materials may be configured as a combination of at least one of a metal powder, a silicon powder and a carbon allotrope powder having high ultrasonic attenuation coefficients and the epoxy resin, as mentioned above. Also, injecting the backing materials into the pores of the porous carbon allotrope foams may mean combining the porous carbon allotrope foams with at least one of the metal powder, the silicon powder and the carbon allotrope powder using the epoxy resin.

Shaded portions in FIG. 4 are regions in which the backing materials are injected. If the backing materials are injected in this way, the ultrasonic waves that may distort the ultrasonic image can be adsorbed, and a clearer image can be obtained.

Also, since heat generated in the piezoelectric layer 11 is dissipated to the outside along the porous carbon allotrope foams, heat to be transferred to the patient through the lens 14 can be minimized. Graphene or CNTs having high thermal conductivity may be used as carbon allotropes to overcome a limitation in thermal conductivity of a metal included in the existing backing layer 12.

If heat dissipation is efficiently performed, the patient's safety can be guaranteed, and the function of the ultrasonic probe can be prevented from being degraded due to high-temperature heat. Also, when power for generating the ultrasonic waves is applied to the ultrasonic probe, higher power can be applied to the ultrasonic probe in consideration of the degree of heat dissipation so that a clearer ultrasonic image can be obtained.

Figure 5:
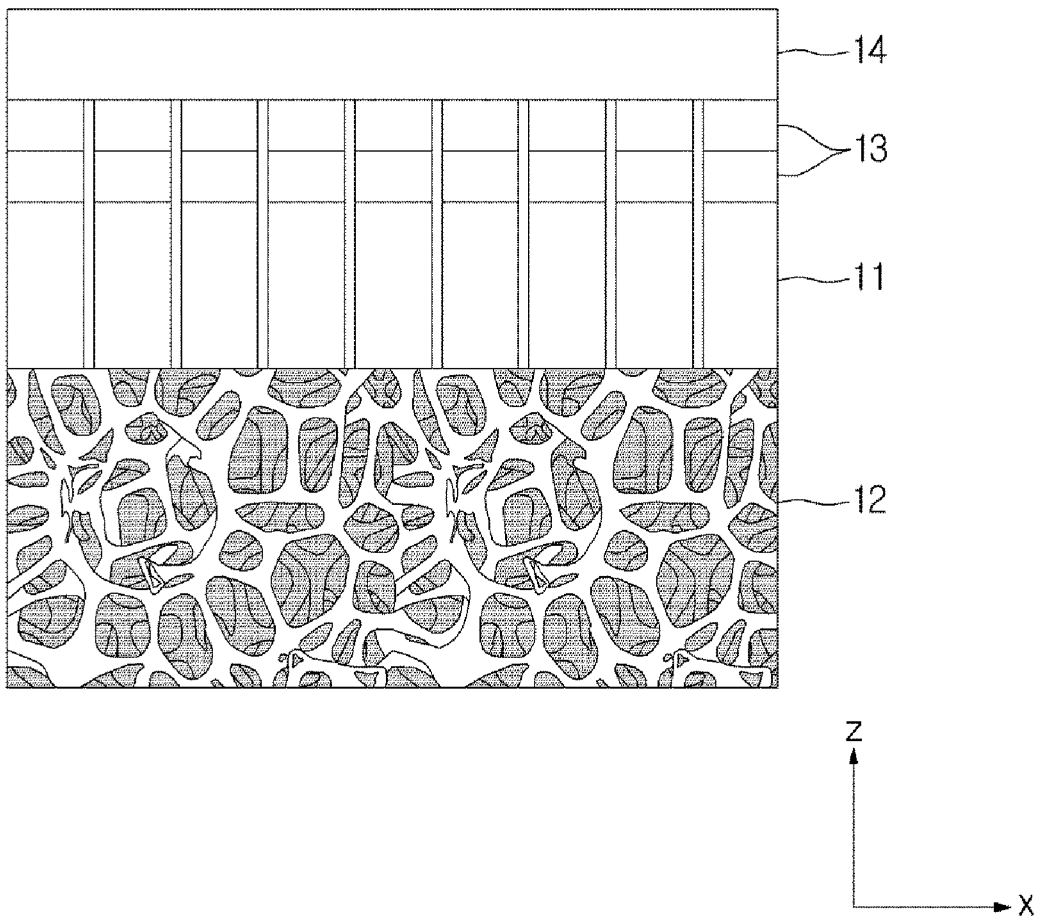
FIG. 5 is a front view of an ultrasonic probe including a backing layer formed of porous carbon allotrope foams in accordance with another embodiment of the present invention.

FIG. 5 is a front view of an ultrasonic probe including a backing layer formed of porous carbon allotrope foams in accordance with another embodiment of the present invention.

Unlike in the ultrasonic probe of FIG. 2, the backing layer 12 is formed of the porous carbon allotrope foams. The porous carbon allotrope foams may be provided in such a way that they are continuously connected to each other in the z-axis direction and a path along which heat moves to a bottom end of the ultrasonic probe is formed.

Also, in FIG. 5, the carbon allotrope foams of the backing layer 12 may be graphene or CNTs having high thermal conductivity. Since these materials have much higher thermal conductivity than metals, a limitation in a heat dissipation function that has been performed using backing materials according to the related art can be overcome.

The backing materials for absorbing the ultrasonic waves generated in the piezoelectric layer 11 can be injected into the pores of the porous carbon allotrope foams. The backing materials may include a combination of at least one of a metal powder, a ceramic powder and a carbon allotrope powder having high ultrasonic attenuation coefficients and the epoxy resin. In this case, a metal used for the backing materials may include at least one of tungsten, copper, and aluminum, and the ceramic powder may include at least one of tungsten oxide and alumina.

As illustrated in FIG. 5, the backing layer 12 formed of the porous carbon allotrope foams is not greatly different from that of the ultrasonic probe of FIG. 1 in terms of the size, the shape or volume. That is, the ultrasonic probe of FIG. 5 having a heat dissipation function can be implemented while maintaining the shape and size of the ultrasonic probe of FIG. 1.

Figure 6:
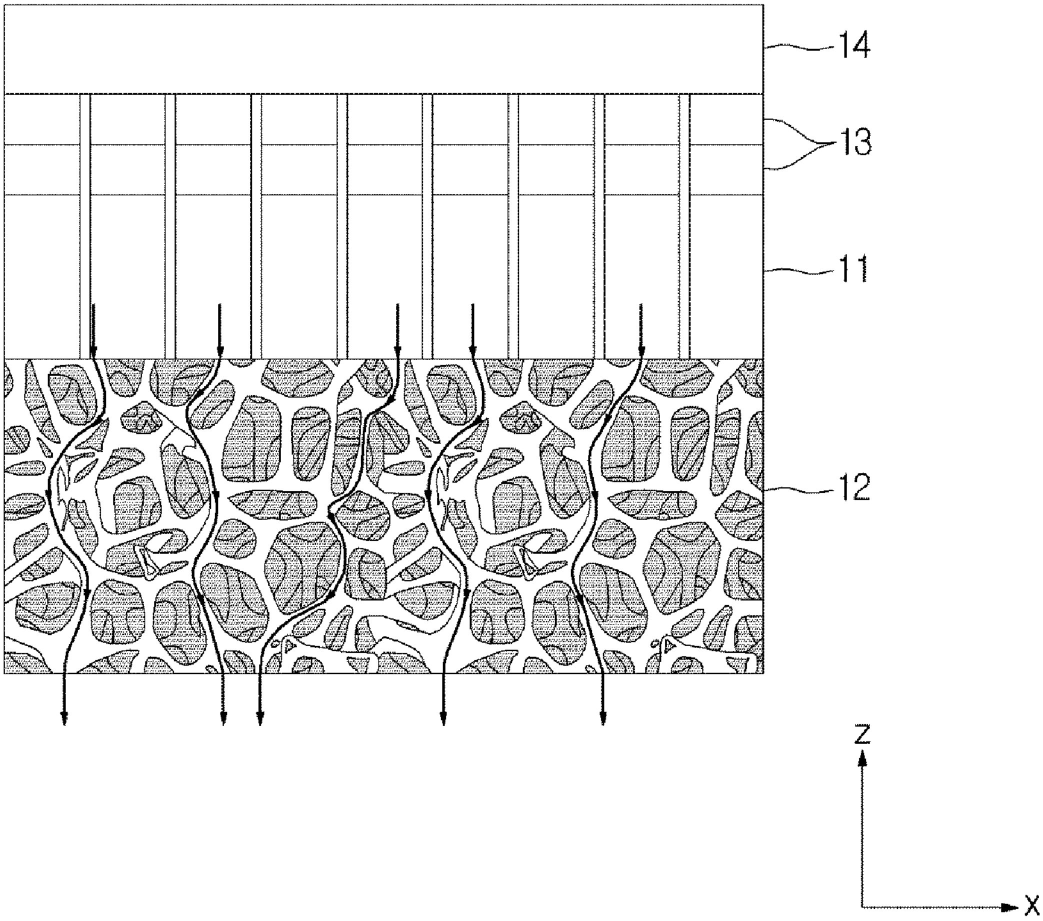
FIG. 6 is a front view of a heat transfer path of the ultrasonic probe including the sound absorption layer formed of the porous carbon allotrope foams.

FIG. 6 is a front view illustrating a heat transfer path of the ultrasonic probe in which a backing layer formed of porous carbon allotrope foams is disposed. Arrows in FIG. 6 represent a path on which heat generated in the piezoelectric layer 11 is dissipated to the outside along the backing layer 12.

As mentioned above, most heat generated in the ultrasonic probe is generated in the piezoelectric layer 11. This is because the piezoelectric layer 11 vibrates due to a voltage, and vibrates due to echo ultrasonic waves to generate electrical signals.

When heat generated in the piezoelectric layer 11 is not dissipated from an inner side of the ultrasonic probe, the heat may be transferred to the lens 14 via the matching layer 13. Since the patient's skin directly contacts the lens 14 when ultrasonic waves are used in a diagnosis, the patient's safety may be compromised when high-temperature heat is transferred to the lens 14.

Thus, the backing layer 12 may be formed to perform a function of dissipating heat generated in the piezoelectric layer 11. In detail, the backing layer 12 may be formed of porous carbon allotrope foams. The porous carbon allotrope foams may be implemented with carbon allotropes having high thermal conductivity and may dissipate heat to the outside at a high speed. In an embodiment of the ultrasonic probe, the carbon allotropes that are used to implement the porous carbon allotrope foams may be graphene or CNTs.

The porous carbon allotrope foams are required to be connected to each other so as to dissipate heat inside the porous carbon allotrope foams to the outside. In particular, since the piezoelectric layer 11 is disposed on the top surface of the backing layer 12, a path on which heat continuously moves in the z-axis direction, is required to be formed.

Referring to the arrows of FIG. 6, heat generated in the piezoelectric layer 11 moves downward along the porous carbon allotrope foams having high thermal conductivity. Heat that moves to a lower part of the backing layer 12 is dissipated to an outer side of the ultrasonic probe.

Although not shown in FIG. 6, a heat sink may be disposed on the bottom surface of the backing layer 12. Since the heat sink may efficiently dissipate heat, the heat sink directly thermally contacts the backing layer 12 so as to assist with heat dissipation.

Also, the heat sink does not directly contact the backing layer 12 but the backing layer 12 and the heat sink may be connected to each other via a heat pipe. In this case, heat that proceeds via the backing layer 12 is transferred to the heat sink along the heat sink and is dissipated to the outside.

In an embodiment of the ultrasonic probe, a heat dissipation fan may be provided so as to assist with a heat dissipation function of the heat sink. The heat sink may include a plurality of plate-shaped fins formed of a metal, such as aluminum, so as to disperse heat. Heat transferred to the heat sink is dispersed into the plurality of fins. A heat dissipation fan may be provided adjacent to the fins so as to promote additional improvements in the heat dissipation function.

Figure 7:
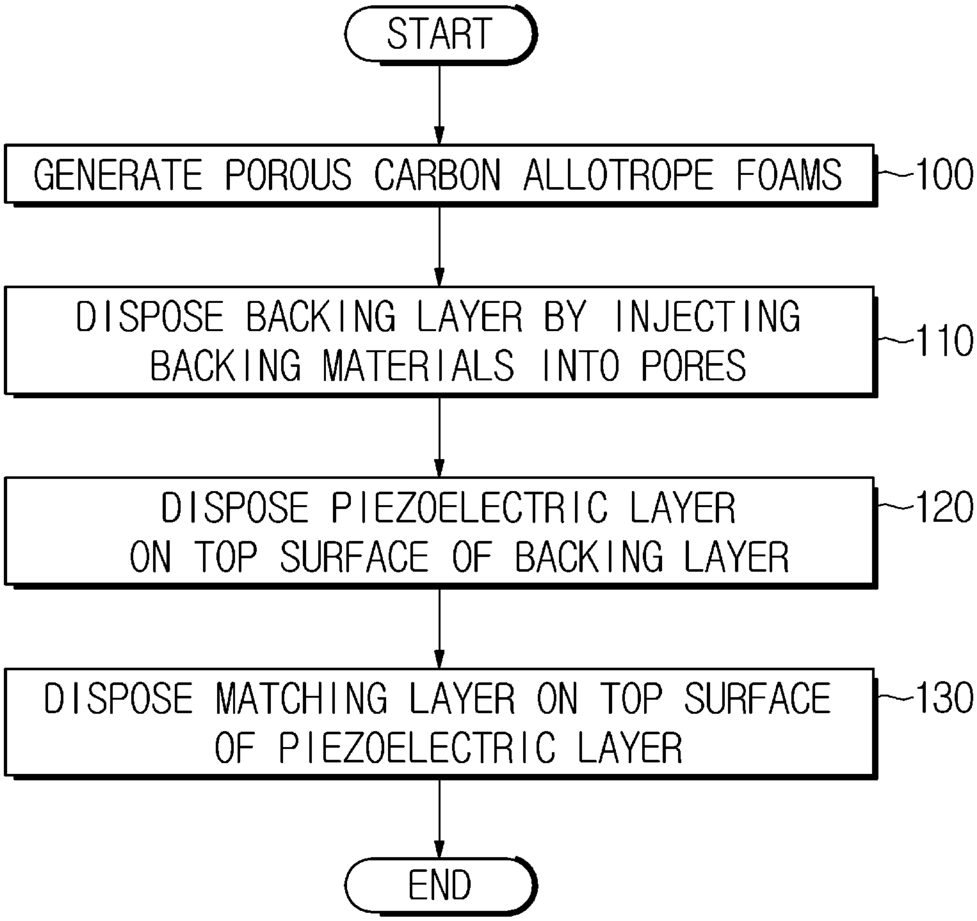
FIG. 7 is a flowchart illustrating a method of manufacturing an ultrasonic probe in accordance with an embodiment of the present invention.

FIG. 7 is a flowchart illustrating a method of manufacturing an ultrasonic probe in accordance with an embodiment of the present invention.

First, porous carbon allotrope foams are generated (100). The porous carbon allotrope foams are generated to form a network on which heat generated in the ultrasonic probe may be efficiently dissipated.

In this case, since carbon allotropes are required to have high thermal conductivity, the carbon allotropes may include at least one of graphene and CNTs in an embodiment of the method of manufacturing the ultrasonic probe. However, this is merely an embodiment, and carbon allotropes having high thermal conductivity may be used.

Several methods may be used to generate the porous carbon allotrope foams. In an embodiment thereof, a bottom-up method, a method using a freeze-drying solution, or a method using a foam base may be used. However, the above-mentioned manufacturing method is merely an embodiment and the present invention is not limited thereto.

The porous carbon allotrope foams may be generated to have a plurality of pores. In this case, a diameter of each of the plurality of pores may be between 1 nm and 1 mm, but this is merely an embodiment, and embodiments of the present invention are not limited thereto. The diameter of each pore may be different depending on the method of manufacturing the porous carbon allotrope foams.

After the porous carbon allotrope foams are generated, a backing layer 12 is disposed by injecting the backing materials into the pores (110). The backing materials are injected to absorb ultrasonic waves generated in the piezoelectric layer 11 that proceed backward (not in a direction of the subject) and may cause distortion of an ultrasonic image.

The backing materials may be configured of a combination of at least one of a metal powder, a ceramic powder and a carbon allotrope powder and an epoxy material. In this case, the metal powder, the ceramic powder or the carbon allotrope powder is required to have a high ultrasonic attenuation coefficient. In an embodiment of the method of manufacturing the ultrasonic probe, the metal powder may include at least one of tungsten, copper and aluminum, and the ceramic powder may include at least one of tungsten oxide and alumina.

Also, injecting the backing materials into the pores of the porous carbon allotrope foams may mean that the porous carbon allotrope foams are combined with at least one of the metal powder, the ceramic powder and the carbon allotrope powder using the epoxy resin.

If the backing layer 12 is disposed, a piezoelectric layer 11 that generates ultrasonic waves is disposed on a top surface of the backing layer 12 (120). The piezoelectric layer 11 and the backing layer 12 (in detail, porous carbon allotrope foams) are provided to directly contact each other so that heat generated in the piezoelectric layer 11 may be transferred directly to the backing layer 12 and may be dissipated to the outside.

Finally, a matching layer 13 is disposed on the top surface of the piezoelectric layer 11 (130), thereby manufacturing the ultrasonic probe.

As described above, in an ultrasonic probe according to the present invention, heat generated in the ultrasonic probe may be easily dissipated using porous carbon allotrope foams.

In addition, backing materials are injected into pores of the porous carbon allotrope foams so that a backing function can be performed.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An ultrasonic probe comprising:

a matching layer;

a piezoelectric layer disposed on a bottom surface of the matching layer; and a backing layer disposed on a bottom surface of the piezoelectric layer and formed of porous carbon allotrope foams and backing materials, wherein the carbon allotropes comprise at least one of graphene and carbon nanotubes (CNTs).

2. The ultrasonic probe of claim 1, wherein, in the backing layer, backing materials are injected into pores of the porous carbon allotrope foams.

3. The ultrasonic probe of claim 1, wherein the backing materials comprise a combined material of at least one of a metal powder, a ceramic powder, and a carbon allotrope powder and an epoxy resin.

4. The ultrasonic probe of claim 1, wherein a diameter of each of the pores of the porous carbon allotrope foams is between 1 nm and 1 mm.

5. The ultrasonic probe of claim 1, further comprising a heat sink that is disposed on a bottom surface of the backing layer and dissipates heat generated in the ultrasonic probe to the outside.

6. A method of manufacturing an ultrasonic probe, the method comprising:

disposing a backing layer comprising backing materials;

disposing a piezoelectric layer on a top surface of the backing layer; and disposing a matching layer on a top surface of the piezoelectric layer, wherein the backing layer further comprises porous carbon allotrope foams, and wherein carbon allotropes of the backing layer comprise at least one of graphene and carbon nanotubes (CNTs).

7. The method of claim 6, wherein the disposing of the backing layer comprises disposing the backing layer by injecting the backing materials into pores of the porous carbon allotrope foams.

8. The method of claim 6, wherein the backing materials are manufactured by combining at least one of a metal powder, a ceramic powder and a carbon allotrope powder and an epoxy resin.

9. The method of claim 6, wherein a diameter of each of pores of the porous carbon allotrope foams is between 1 nm and 1 mm.

10. The method of claim 6, further comprising disposing a heat sink that dissipates heat generated in the ultrasonic probe to the outside on a bottom surface of the backing layer.

* * * * *